(12) United States Patent
Yan et al.

(10) Patent No.: US 9,998,825 B2
(45) Date of Patent: *Jun. 12, 2018

(54) DISTRIBUTED AUTOMATIC LEVEL CONTROL FOR A MICROPHONE ARRAY

(71) Applicant: Invensense, Inc., San Jose, CA (US)

(72) Inventors: Dongqin Yan, Shanghai (CN); Jie Fu, Shenzhen (CN); Yang Pan, Shanghai (CN)

(73) Assignee: Invensense, Inc., San Jose, CA (US)

(*) Notice: Subject to any disclaimer, the term of this patent is extended or adjusted under 35 U.S.C. 154(b) by 0 days. days.

This patent is subject to a terminal disclaimer.

(21) Appl. No.: 15/406,388

(22) Filed: Jan. 13, 2017

(65) Prior Publication Data

US 2017/0127178 A1    May 4, 2017

Related U.S. Application Data

(63) Continuation of application No. 13/790,081, filed on Mar. 8, 2013, now Pat. No. 9,549,251.

(51) Int. Cl.
*H04R 3/00* (2006.01)
*H04R 29/00* (2006.01)
*H03G 3/00* (2006.01)

(52) U.S. Cl.
CPC ............ *H04R 3/005* (2013.01); *H03G 3/002* (2013.01); *H04R 29/006* (2013.01); *H04R 2201/003* (2013.01)

(58) Field of Classification Search
CPC .. G06F 13/4291; H03G 3/3005; H04J 3/0685; H04J 3/1605; H04R 2430/01; H04R 3/005; Y02B 60/1228; Y02B 60/1235
USPC .............. 370/498, 503, 509, 517; 381/92
See application file for complete search history.

(56) References Cited

U.S. PATENT DOCUMENTS

| | | | | | |
|---|---|---|---|---|---|
| 4,090,032 A | * | 5/1978 | Schrader | ................ | H04R 3/005 381/108 |
| 4,316,060 A | * | 2/1982 | Adams | .................. | H03G 5/165 381/98 |
| 4,922,536 A | * | 5/1990 | Hoque | ................... | H04H 20/28 370/535 |
| 5,406,634 A | * | 4/1995 | Anderson | .............. | H04R 27/00 381/80 |
| 7,006,642 B1 | * | 2/2006 | Kumai | .................. | H04H 60/04 369/4 |

(Continued)

FOREIGN PATENT DOCUMENTS

CN            102047688 A        5/2011

*Primary Examiner* — Khai N Nguyen
(74) *Attorney, Agent, or Firm* — Fountainhead Law Group P.C.

(57) ABSTRACT

A distributed automatic level control function is provided, in which information relating to a common automatic level control parameter is transmitted to each of a plurality of microphone devices, wherein the information transmitted to at least one microphone device is derived from an audio sample of at least one different microphone device. Each microphone device produces the common automatic level control parameter based on the information received by the microphone device and applies the common automatic level control parameter produced by the microphone device to a distributed automatic level controller of the microphone device.

8 Claims, 16 Drawing Sheets

(56) References Cited

U.S. PATENT DOCUMENTS

| | | | |
|---|---|---|---|
| 7,305,095 B2* | 12/2007 | Rui | H04R 3/005 381/122 |
| 8,204,258 B2 | 6/2012 | Craig et al. | |
| 8,433,075 B2* | 4/2013 | Elko | H04R 3/005 381/92 |
| 8,582,254 B2* | 11/2013 | Aimi | H01H 59/0009 361/2 |
| 8,619,821 B2* | 12/2013 | Pan | H04J 3/1605 370/498 |
| 8,731,002 B2* | 5/2014 | Pan | H04J 3/1605 370/503 |
| 8,990,464 B2* | 3/2015 | Kessler | G06F 13/4295 710/104 |
| 9,417,944 B2* | 8/2016 | Kessler | G06F 13/4295 |
| 9,549,251 B2* | 1/2017 | Yan | H04R 3/005 |
| 2008/0037802 A1 | 2/2008 | Posa et al. | |
| 2010/0284525 A1* | 11/2010 | Sander | H04R 1/1091 379/93.06 |
| 2011/0051953 A1* | 3/2011 | Makinen | H04R 1/406 381/92 |
| 2011/0198967 A1* | 8/2011 | Aimi | H01H 59/0009 310/300 |
| 2011/0313763 A1 | 12/2011 | Amada | |
| 2012/0243559 A1* | 9/2012 | Pan | H04J 3/1605 370/503 |
| 2012/0288124 A1* | 11/2012 | Fejzo | H04R 5/02 381/303 |
| 2012/0303363 A1 | 11/2012 | Sorensen | |
| 2013/0121505 A1* | 5/2013 | Duraiswami | H04R 3/005 381/92 |
| 2013/0144542 A1* | 6/2013 | Ernst | B81C 1/00238 702/23 |
| 2014/0254823 A1* | 9/2014 | Yan | H04R 3/005 381/92 |
| 2016/0269843 A1* | 9/2016 | Terada | H04R 29/008 |
| 2017/0127178 A1* | 5/2017 | Yan | H04R 3/005 |

* cited by examiner

1601 — Take audio sample for Frame(X), i.e., Sample(X);
1602 — Receive [Information, Common] from predecessor device;
1603 — If device is the initial device (i.e., received Information relates to Frame(X-1))
　1604 — Determine the common ALC parameter for Frame(X-1) based on the received Information and Sample(X-1);
　1605 — Common = common ALC parameter for Frame(X-1);
　1606 — Determine initial Information for Frame(X) based on Sample(X);
　1607 — Information = initial Information for Frame(X);
1608 — Else (i.e., received Information relates to Frame(X), received Common is the common ALC parameter determined by the initial device for Frame(X-1))
　1609 — Determine updated Information for Frame(X) based on received Information and Sample(X);
　1610 — Information = updated Information for Frame(X);
　1611 — Common = received Common;
　Endif
1612 — Transmit [Information, Common];
1613 — Apply Common to ALC, e.g., could be used to process Sample(X-1) or Sample(X) or for some other ALC function;

*FIG. 16*

DISTRIBUTED AUTOMATIC LEVEL CONTROL FOR A MICROPHONE ARRAY

CROSS-REFERENCE TO RELATED APPLICATION(S)

This application is a continuation application of U.S. patent application Ser. No. 13/790,081, filed by Dongqin Yan et al., filed on Mar. 8, 2013, and entitled "DISTRIBUTED AUTOMATIC LEVEL CONTROL FOR A MICROPHONE ARRAY", now U.S. Pat. No. 9,549,251.

The subject matter of this patent application may be related to the subject matter of commonly-owned U.S. patent application Ser. No. 13/426,918, entitled "SYNCHRONIZATION, RE-SYNCHRONIZATION, ADDRESSING, AND SERIALIZED SIGNAL PROCESSING FOR DAISY-CHAINED COMMUNICATION DEVICES", filed on Mar. 22, 2012, now U.S. Pat. No. 8,731,002, which claims the benefit of U.S. Provisional Patent Application No. 61/467,538 filed Mar. 25, 2011.

The subject matter of this patent application also may be related to the subject matter of commonly-owned U.S. patent application Ser. No. 13/071,836 entitled "SYSTEM, APPARATUS, AND METHOD FOR TIME-DIVISION MULTIPLEXED COMMUNICATION", filed on Mar. 25, 2011, now U.S. Pat. No. 8,619,821.

The subject matter of this patent application also may be related to the subject matter of commonly-owned U.S. patent application Ser. No. 13/646,397, entitled "TWO-WIRE COMMUNICATION SYSTEM FOR HIGH-SPEED DATA AND POWER DISTRIBUTION", filed on Oct. 5, 2012, now U.S. Pat. No. 9,417,944, which claims the benefit of U.S. Provisional Patent Application No. 61/543,379.

The subject matter of this patent application also may be related to the subject matter of commonly-owned U.S. patent application Ser. No. 13/646,382, entitled "METHODS FOR DISCOVERY, CONFIGURATION, AND COORDINATING DATA COMMUNICATIONS BETWEEN MASTER AND SLAVE DEVICES IN A COMMUNICATION SYSTEM", filed on Oct. 5, 2012, which claims the benefit of U.S. Provisional Patent Application No. 61/543,380, now U.S. Pat. No. 8,990,464.

Each of these patent applications is hereby incorporated herein by reference in its entirety.

FIELD OF THE INVENTION

The present invention relates generally to microphone arrays systems and, more particularly, to distributed automatic level control (ALC) processing in microphone array systems such as MEMS microphone arrays.

BACKGROUND OF THE INVENTION

Many audio systems implement automatic level control (ALC) to dynamically adjust the signal level of an input signal, such as from a microphone. Generally speaking, ALC involves increasing the signal level (gain) of the input signal when the input signal level is below a predetermined minimum level and reducing the signal level (gain) of the input signal when the input signal level is above a predetermined maximum level, for example, using a programmable gain amplifier (PGA). Specifically, when the input signal level becomes smaller than a predetermined target level, the ALC will ramp up the gain of the PGA after some hold time. The gain change rate is referred to as the decay time. When the input signal level becomes above the target level, the ALC will reduce the gain of the PGA at a rate referred to as the attack time.

FIG. 1 is a schematic diagram providing an example of ALC operation, specifically showing a representation of an input signal 110, a representation of the PGA gain curve 120 performed by the ALC, and a representation of the output signal 130 resulting from ALC. In this example, the input signal 110 has a first portion 111 in which the signal level is within the target level, a second portion 112 in which the signal level is smaller than the target level, and a third portion 113 in which the signal level is above the target level. During the first portion 111 of the input signal 110, the ALC performs no PGA gain change, such that the signal level of a corresponding portion 131 of the output signal 130 is unchanged from the first portion 111 of the input signal 110. During the second portion 112 of the input signal 110, the input signal level becomes smaller than the target level. After a predetermined hold time 132, since the input signal level is still smaller than the target level, the ALC increases the gain of the PGA over a predetermined decay time 133 so that the output signal level reaches the target level and remains at the target level through time period 134, representing the remainder of the second portion 112 of the input signal 110. During the third portion 113 of the input signal, the input signal level becomes above the target level. The ALC decreases the gain of the PGA over a predetermined attach time 135 so that the output signal level reaches the target level and remains at the target level for time period 136.

The ALC sometimes provides a noise gate mode to deal with the situation in which there is little or no input signal level (e.g., when nobody is speaking into the microphone or the microphone is muted). When the signal is very quiet and consists mainly of noise, the ALC function may cause a phenomenon often referred to as "noise pumping." The noise gate mode prevents noise pumping by comparing the signal level at the input against a noise gate threshold and controlling the gain of the PGA or other output control accordingly, such as, for example, setting the gain to zero, muting the output signal, or keeping the gain the same as it was before the signal was recognized as noise.

FIG. 2 is a schematic diagram providing an example of a noise gate mode, specifically showing a representation of an input signal 210, and a representation of the PGA gain curve 230, and a representation of the output signal 220 resulting from the ALC with noise gate mode. In this example, the input signal 210 has a first portion 211 in which the signal level is above the noise gate threshold, a second portion 212 in which the signal level is below than the noise gate threshold, and a third portion 213 in which the signal level is above the noise gate threshold. During the first portion 211 of the input signal 210, the ALC increases the gain of the PGA 230 so as to increase the output signal level 220 into the target level. During the second portion 212 of the input signal 210, the ALC holds the gain level of the PGA 230 so that the noise is not amplified in the output signal 220. During the third portion 213, the ALC increases the gain of the PGA 230 so that the output signal level 220 is at the target level.

Thus, the ALC can boost low level signals to make them heard more clearly, limit high level signals at a fixed level to avoid output clipping, and eliminate noisy signals from the output or keep noisy signals at a very low level in the output. ALC is usually integrated into post processing chips that process raw microphone data from the microphone(s).

In microphone array systems such as MEMS microphone arrays, some amount of signal processing often is incorporated into each of a plurality of microphone devices for local processing the microphone input signal by the microphone device. As described in U.S. patent application Ser. No. 13/426,918, data may be passed from one microphone device to another microphone device in a daisy-chain configuration to allow for serialized signal processing, such as for beamforming, noise reduction/cancellation, or acoustic source localization, to name but a few.

SUMMARY OF EXEMPLARY EMBODIMENTS

In one embodiment there is provided a method for distributed automatic level control processing in a system having a plurality of microphone devices, each microphone device having a distributed automatic level controller and producing a succession of audio samples. The method involves transmitting, to each microphone device, information relating to a common automatic level control parameter, wherein the information transmitted to at least one microphone device is derived from an audio sample of at least one different microphone device; producing, by each microphone device, the common automatic level control parameter based on the information received by the microphone device; and applying, by each microphone device, the common automatic level control parameter produced by the microphone device to the distributed automatic level controller of the microphone device.

In another embodiment there is provided a system for distributed automatic level control processing. The system includes a plurality of microphone devices, each microphone device having a communication interface and a distributed automatic level controller and producing a succession of audio samples, wherein the distributed automatic level controller of each microphone device is configured to receive via the communication interface information relating to a common automatic level control parameter derived from an audio sample of at least one different microphone device, produce the common automatic level control parameter based on the received information, and apply the common automatic level control parameter for an automatic level control function of the device.

In various alternative embodiments, transmitting information relating to the common automatic level control parameter may involve, in a first phase, transmitting an initial value by an initial device to a next successive device and transmit, by each successive device, an updated value based on a value received from a predecessor device; and, in a second phase, transmitting the common automatic level control parameter by the initial device to the next successive device and transmitting the common automatic level control value by each successive device. Producing the common automatic level control parameter based on the information received by the microphone device may involve producing the common automatic level control parameter based on the information received by the microphone device and at least one audio sample of the microphone device. The succession of audio samples may be logically divided into a number of successive frames, wherein all of said microphone devices may apply the common automatic level control parameter to a respective audio sample associated with a common frame. The common automatic level control parameter may be derived from audio samples associated with the common frame and/or a frame earlier than the common frame. The microphone devices may be configured in a daisy-chain configuration, wherein at least one microphone device may transmit information relating to the common automatic level control parameter to a next successive microphone device in the daisy-chain configuration. The common automatic level control parameter may comprise a value computed from at least one audio sample from each microphone device. The common automatic level control parameter produced by the microphone device may be used as a reference value in the automatic level controller, may be used to program a programmable gain amplifier based on the common automatic level control parameter, and/or may be used to process audio sample data of the microphone device based on the common automatic level control parameter to produce processed audio sample data for transmission over a communication system. Information relating to the common automatic level control parameter may be transmitted to a master/host device, which may be configured to process data from the microphone devices based on the common automatic level control parameter.

In another embodiment there is provided a microphone device including a microphone for producing a succession of audio samples, a communication interface, and a distributed automatic level controller, wherein the distributed automatic level controller is configured to receive via the communication interface information relating to a common automatic level control parameter derived from an audio sample of at least one different microphone device, produce the common automatic level control parameter based on the received information, and apply the common automatic level control parameter to the distributed automatic level controller.

In various alternative embodiments, the device may produce the common automatic level control parameter based on the information received by the device and at least one audio sample of the microphone device. The succession of audio samples may be logically divided into a number of successive frames, the common automatic level control parameter may be derived from information associated with a first given frame, and the common automatic level control parameter is applied to one of the first given frame or another frame. The common automatic level control parameter produced by the microphone device may be used as a reference value in the automatic level controller, may be used to program a programmable gain amplifier based on the common automatic level control parameter, and/or may be used to process audio sample data of the microphone device based on the common automatic level control parameter to produce processed audio sample data for transmission over a communication system.

Additional embodiments may be disclosed and claimed.

BRIEF DESCRIPTION OF THE DRAWINGS

The foregoing and advantages of the invention will be appreciated more fully from the following further description thereof with reference to the accompanying drawings wherein:

FIG. 16 is a simplified logic flow diagram for a recursive process for determining and distributing a common automatic level control parameter, in accordance with one exemplary embodiment;

It should be noted that the foregoing figures and the elements depicted therein are not necessarily drawn to consistent scale or to any scale. Unless the context otherwise suggests, like elements are indicated by like numerals.

DETAILED DESCRIPTION OF SPECIFIC EMBODIMENTS

In embodiments of the present invention, automatic level control (ALC) is performed in a distributed manner by a plurality of microphone devices in a microphone array, where each microphone device performs an ALC function based on a common automatic level control parameter produced by each microphone device based on aggregated data from the plurality of microphone devices. For example, the aggregated data may include raw microphone data from all of the microphone devices, a maximum or minimum peak or RMS value calculated the microphone devices, an average signal level value, a gain value, or other automatic level control parameter.

Figure 1:
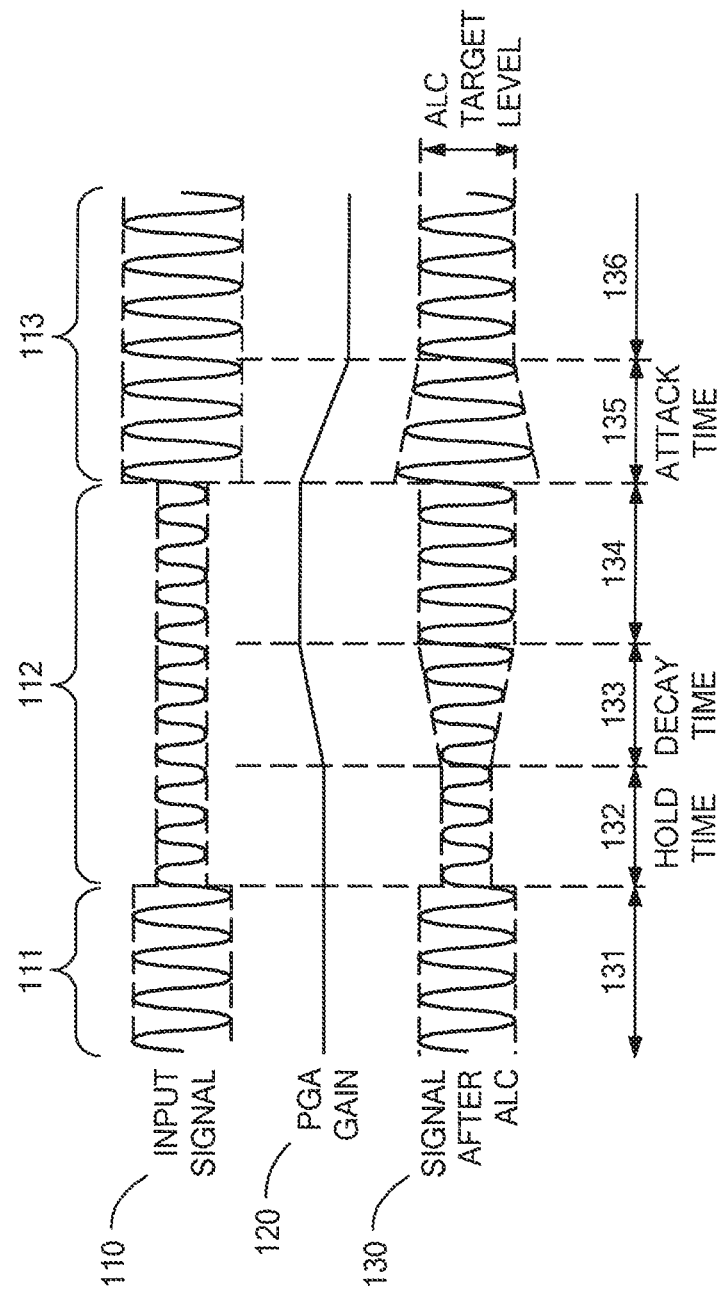
FIG. 1 is a schematic diagram providing an example of ALC operation, specifically showing a representation of an input signal 110, a representation of the PGA gain curve 120 performed by the ALC, and a representation of the output signal 130 resulting from ALC.
Figure 2:
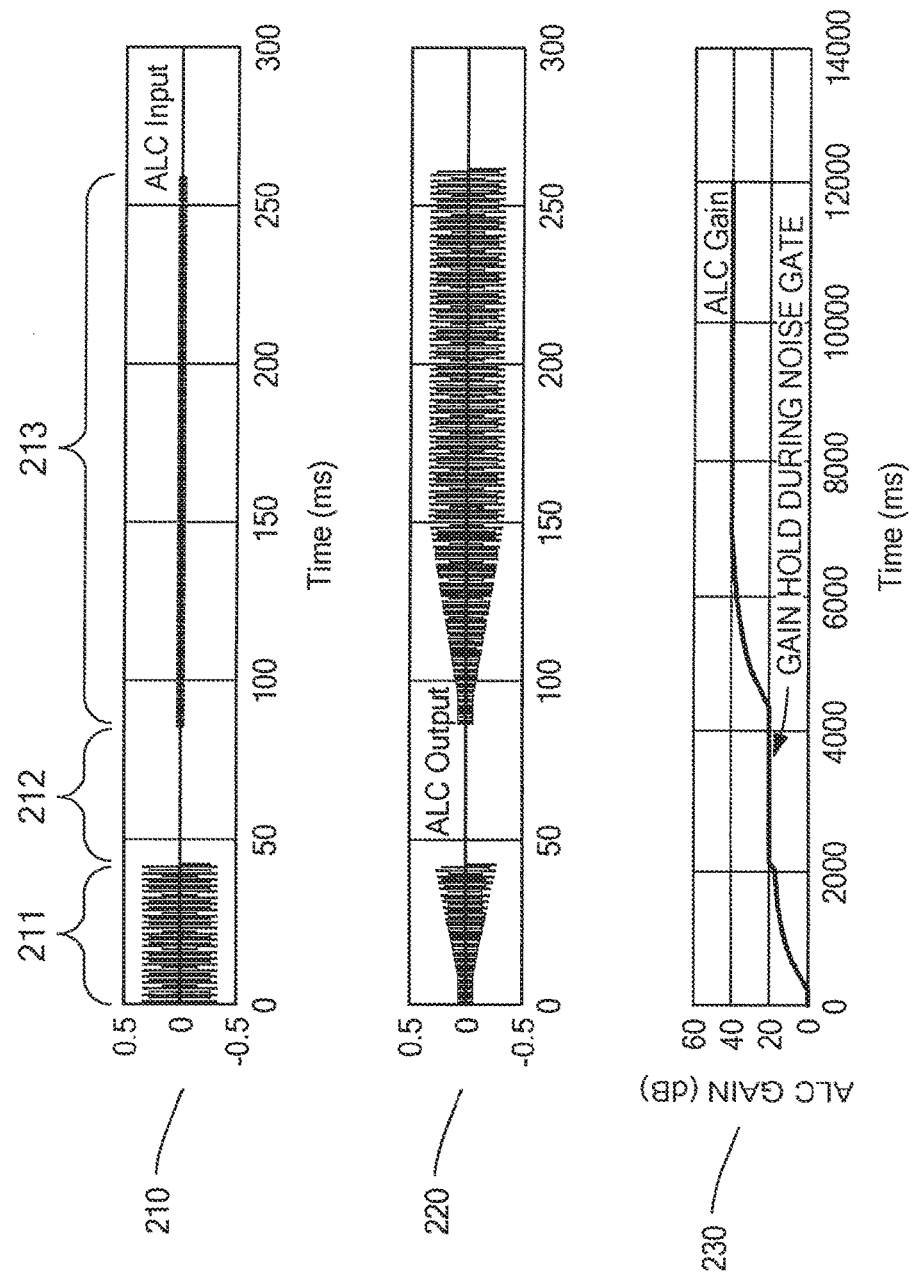
FIG. 2 is a schematic diagram providing an example of a noise gate mode, specifically showing a representation of an input signal 210, and a representation of the PGA gain curve 230, and a representation of the output signal 220 resulting from the ALC with noise gate mode.
Figure 3:
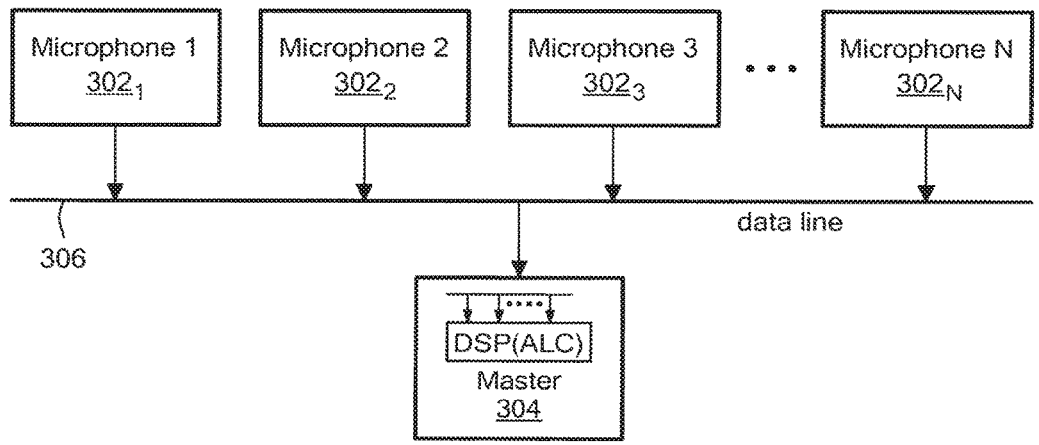
FIG. 3 is a schematic block diagram showing one example of a microphone array in which each microphone sends raw microphone data to a master device, as known in the art.

In certain prior art systems, each microphone device sends raw microphone data to a master device, which processes the raw data to perform ALC on the microphone data samples. FIG. 3 is a schematic block diagram showing one example of a microphone array in which each microphone sends raw microphone data to a master device, as known in the art. Specifically, each microphone device $302_1$-$302_N$ sends raw microphone data via communication bus 306 to master device 304, which includes a digital signal processor or other circuit configured to perform ALC on the raw data samples received from the microphone devices.

Figure 4:
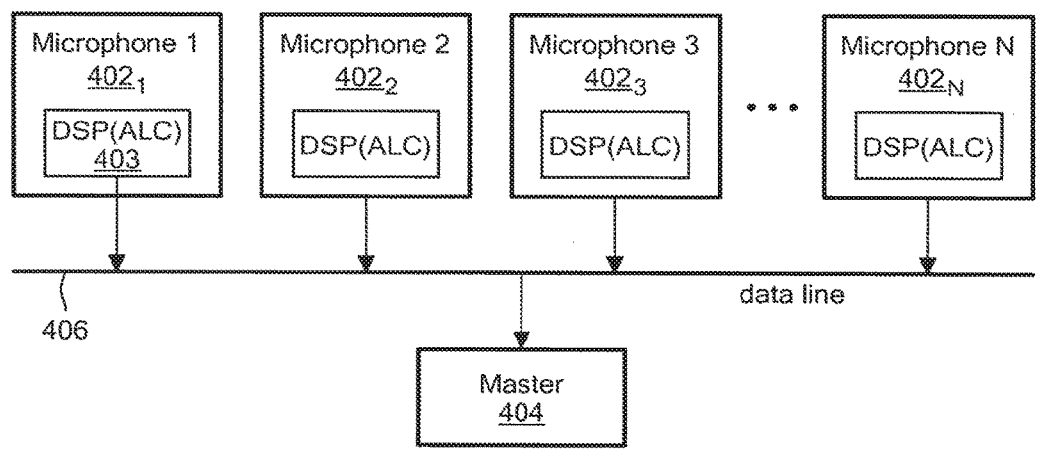
FIG. 4 is a schematic block diagram showing one example of a microphone array in which each microphone performs its own ALC function and sends processed data to the master device, as known in the art.

In certain other prior art systems, each microphone device independently performs its own ALC function and sends processed data to the master device. FIG. 4 is a schematic block diagram showing one example of a microphone array in which each microphone performs its own ALC function and sends processed data to the master device, as known in the art. Specifically, each microphone device $402_1$-$402_N$ includes a digital signal processor or other circuit 403 configured to perform ALC on the raw data samples generated a local microphone (not shown for convenience) and sends processed microphone data via communication bus 406 to master device 404, which may then further process the (processed) data samples received from the microphone devices.

Figure 5:
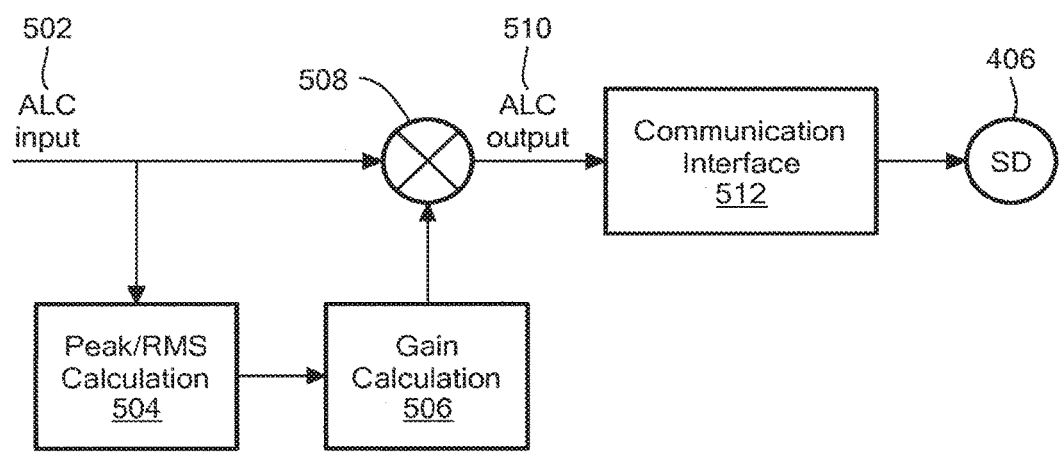
FIG. 5 is a schematic block diagram showing one example of a feed-forward ALC logic arrangement for the processor or circuit, as known in the art.

FIG. 5 is a schematic block diagram showing one example of a feed-forward ALC logic arrangement for the processor or circuit 403, as known in the art. Here, the microphone data (ALC input) 502 is processed 504 to estimate a characteristic such as the peak or RMS value of the input signal, and the gain is adjusted 506 based on that information. The ALC input 502 and the adjusted gain 506 are combined 508 to produce ALC output 510, which then may be transmitted by a bus interface 512 via communication bus 406 to the master device.

One issue with the independent ALC function of the type described with reference to FIGS. 4 and 5 is that each microphone device may have a different amount of gain added to its signal and all of the microphone signals may be normalized to the target level, which may be problematic for certain types of post-processing in which differences in the signal levels may be utilized, such as for voice orientation/localization, noise cancellation, or other types of post-processing.

Distributed Automatic Level Control

Figure 6:
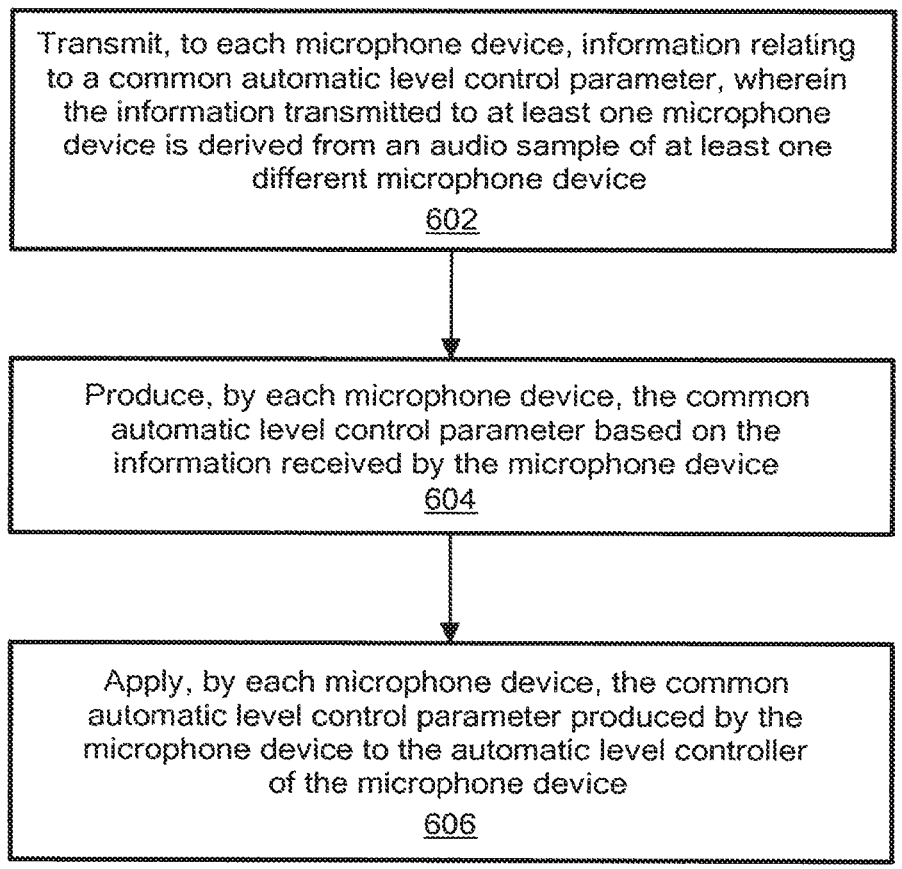
FIG. 6 is a logic flow diagram for distributed automatic level control operation, in accordance with one exemplary embodiment of the present invention.

FIG. 6 is a logic flow diagram for distributed automatic level control operation, in accordance with one exemplary embodiment of the present invention. In this exemplary embodiment, information relating to a common automatic level control parameter is transmitted to each microphone device (and optionally also the master/host device), wherein the information transmitted to at least one microphone device is derived from an audio sample of at least one different microphone device (block 602). Typically, each microphone device transmits information to an adjacent microphone device, such as when the microphone devices are arranged in a daisy-chain or ring configuration. In any case, each microphone device (and optionally the master/host device) then independently produces the common automatic level control parameter based on the received information (block 604) and applies the common automatic level control parameter to the automatic level controller of the microphone device (block 606) (or, in the case of the master/host device, processes data received from the microphone devices based on the common automatic level parameter). It should be noted that, in certain embodiments, "producing" the common automatic level control parameter by certain devices may not involve any computation, such as, for example, when the parameter to be used by each device's distributed automatic level controller is computed by one device and distributed to the other devices. In other embodiments, however, each device may need to compute the common automatic level control parameter based on received information and optionally based on other information, such as locally-generated audio sample data.

The common automatic level control parameter may be used by each microphone device for any of a variety of automatic level control functions, such as using the common automatic level control parameter as a reference value in the automatic level controller, programming a programmable gain amplifier based on the common automatic level control parameter, and/or processing audio sample data of the microphone device based on the common automatic level control parameter to produce processed audio sample data and transmitting the processed audio sample data over a communication system. For example, the common automatic level control parameter may be a maximum or minimum peak or RMS value across all of the microphone devices for a set of related audio samples (e.g., audio samples taken by the microphone devices in a given sampling frame, where the audio sampling may be synchronized). The common automatic level control parameter may be used, for example, to set a common amount of gain across all microphone devices (optionally subject to a predetermined maximum or minimum amount of gain or resulting signal level), to normalize all audio samples to a common gain level (e.g., the common automatic level control parameter may be used as a common reference value for setting gain by each microphone device), to provide a common noise gate threshold for all of the microphone devices (e.g., for selectively muting microphones that are below a minimum value determined across all microphone devices), or for other automatic level control operation.

Figure 7:
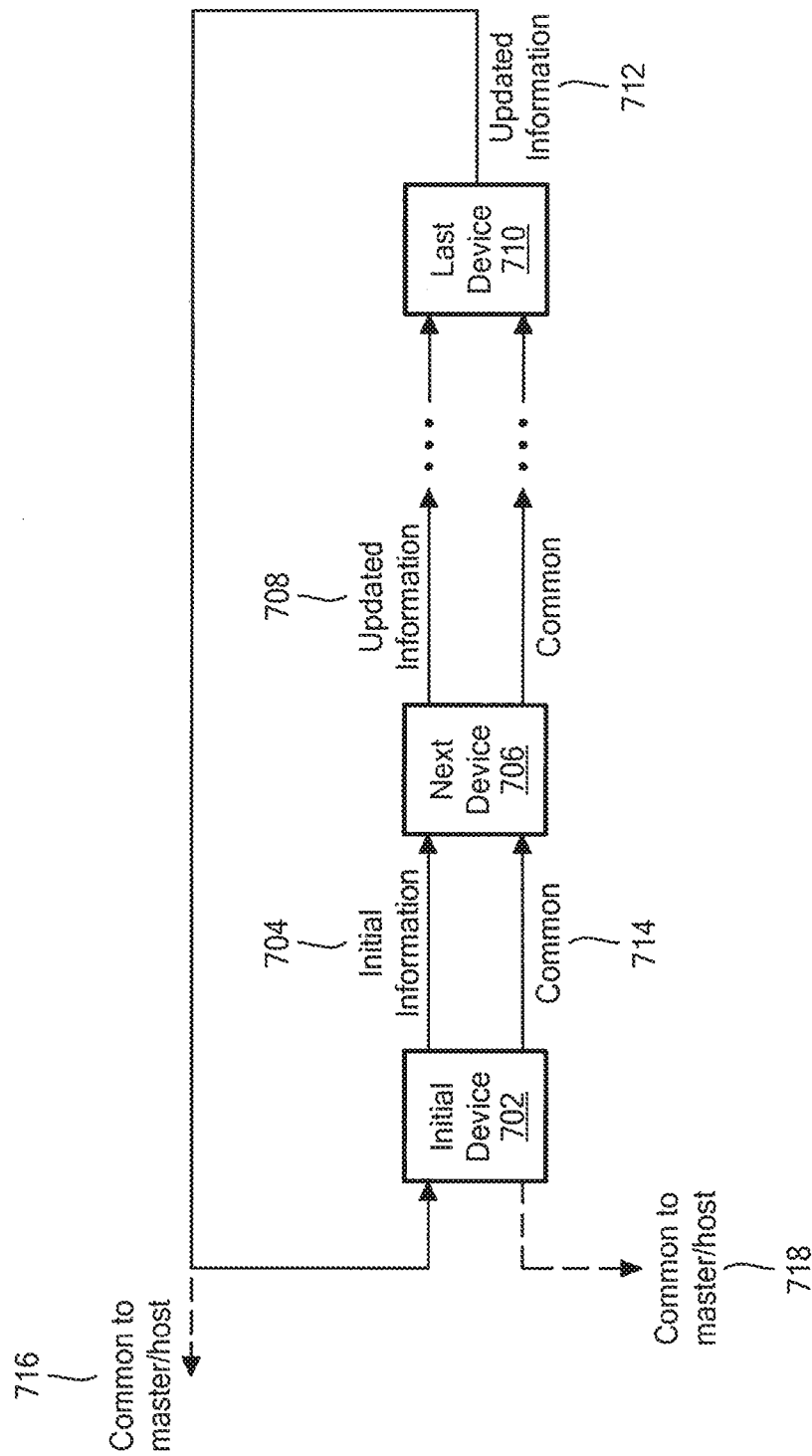
FIG. 7 is a schematic diagram depicting a sequence for exchanging information allowing the microphone devices to produce the common automatic level control parameter, in accordance with one exemplary embodiment.

In one exemplary embodiment depicted schematically in FIG. 7, in order for each microphone device to produce the common automatic level control parameter, an initial microphone device 702 (which may or may not be the first microphone device in a daisy-chain of devices) transmits initial information 704 based on an audio sample of the microphone device to a next successive microphone device 706, and each successive microphone device receives information from the predecessor microphone device and transmits updated information (e.g., updated information 708 transmitted by microphone device 706) based on the received information and its own audio sample data to the next successive device (where the updated information may be the same as the received information or may be different than the received information depending on any of a variety of factors). When the initial microphone device receives updated information 712 from the last microphone device 710, it then can produce a common automatic level control parameter and distribute it to the other microphone devices, such as by transmitting the common automatic level control parameter 714 to the next successive microphone device for transfer by each successive microphone device until all microphone devices have received the common automatic level control parameter. The initial microphone device 702 (or another microphone device, e.g., the last device 710) additionally may transmit the common automatic level control parameter to the master/host device, e.g., over the same data path used by the microphone devices to exchange data 716 or over a separate path 718 (where the dashed lines for paths 716 and 718 indicate that various embodiments may include one, the other, both, or neither path). Each microphone device then applies the common automatic level control parameter to the automatic level controller of the microphone device. The master/host device may use the common automatic level control parameter to process data received from the microphone devices.

Thus, in the example described above with reference to FIG. 7, the determination and distribution of the common automatic level control parameter essentially involves two stages, i.e., a first stage in which information for determining the common automatic level control parameter is exchanged and a second stage in which the common automatic level control parameter is determined and distributed.

In various alternative embodiments, the information transmitted by one microphone device to another may include raw data (e.g., an audio sample) or processed data (e.g., a maximum or minimum peak/RMS value calculated from the audio sample and/or any received information). For example, the information transmitted from one microphone device to another may include raw audio sample data, a peak or RMS value computed from an audio sample, a gain value, a maximum signal level for a particular audio sampling frame, a minimum signal level for a particular audio sampling frame, or other information related to a common automatic level control parameter as may be used in a particular implementation.

In one exemplary embodiment, for example, when the common automatic level control parameter is a maximum peak or RMS value, the initial microphone device transmits its raw audio sample data to the next successive microphone device, and each successive microphone device receives raw audio sample data from its predecessor, compares determines the peak or RMS value for the received raw audio data sample and also for its own sample, and transmits the audio sample data having the greater peak or RMS value (i.e., it transmits either the received audio sample data or its own audio sample data, whichever has the higher peak or RMS value). When the initial microphone device receives the raw audio sample data from the last microphone device, it compares the received raw audio sample data with its own audio sample to determine the maximum peak or RMS value across all of the microphone devices. If the initial microphone device had the maximum peak or RMS value, then the initial microphone device may receive the same value that it transmitted; otherwise, the initial microphone device may receive a different value than in transmitted. In any case, once the initial microphone device determines the maximum peak or RMS value across all of the microphone devices, the initial microphone device can then transmit the audio sample having the maximum peak or RMS value (or alternatively transmit the maximum peak or RMS value) to the other microphone devices for use by each microphone device in implementing its ALC function.

Figure 8:
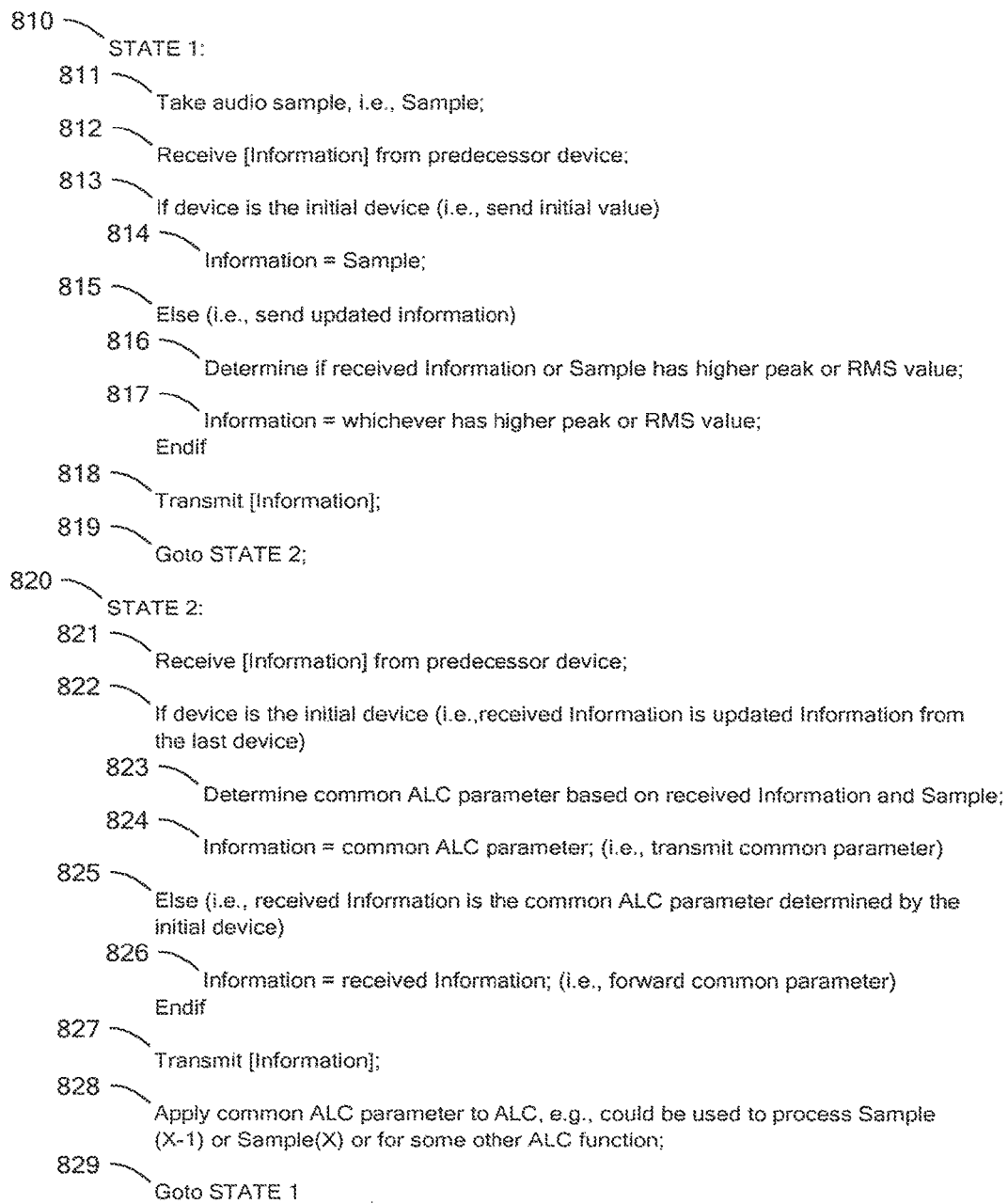
FIG. 8 is a simplified logic flow diagram for a two-stage process for determining and distributing a common automatic level control parameter based on exchange of raw audio data samples, in accordance with one exemplary embodiment.

FIG. 8 is a simplified logic flow diagram for a two-stage process for determining and distributing a common automatic level control parameter based on exchange of raw audio data samples, in accordance with one exemplary embodiment.

During the first stage (i.e., State 1—810), each microphone device takes an audio sample (811), typically synchronized to a common reference clock. Each microphone device also receives Information (812) from its predecessor device in the normal course. If the device is the initial device (813), then the information to be transmitted by the device is the raw audio sample data (814). Otherwise (815), the microphone device determines if the received Information or the Sample has a higher peak or RMS value (816), where the information to be transmitted by the device is the one having the higher peak or RMS value (817). The microphone device transmits its information to the next successive device (818) and transitions to State 2 (819).

During the second stage (i.e., State 2—820), each device receives Information from its predecessor device (821). If the device is the initial device (822), then the received Information is updated information from the last microphone device, in which case the device determines the common automatic level control parameter based on the received Information and the devices audio sample data (823), and the information to be transmitted by the device is the common automatic level control parameter (824). Otherwise (825), the received information is the common automatic level control parameter passed from its predecessor device, in which case the information to be transmitted by the device is the received Information (826), i.e., the device simply passes along the value it received. The device transmits the common automatic level control parameter to the next successive device (827), optionally may apply the common automatic level control parameter to the automatic level controller (828), and transitions to State 1 (829).

In another exemplary embodiment, for example, when the common automatic level control parameter is a maximum peak or RMS value, the initial microphone device determines a peak or RMS value for its audio sample and transmits the value to the next successive microphone device. Each successive microphone device receives a peak or RMS value from its predecessor, determines a peak or RMS value for its own audio sample, compares the received peak or RMS value to its own peak or RMS value, and transmits the higher value (i.e., it transmits either the received value or its own value, whichever is higher). When the initial microphone device receives the value from the last microphone device, it compares the received value with its own value to determine the maximum peak or RMS value across all of the microphone devices. If the initial microphone device had the maximum peak or RMS value, then the initial microphone device may receive the same value that it transmitted; otherwise, the initial microphone device may receive a different value than in transmitted. In any case, once the initial microphone device determines the maximum peak or RMS value across all of the microphone devices, the initial microphone device can then transmit the maximum peak or RMS value to the other microphone devices for use by each microphone device in implementing its ALC function.

Figure 9:
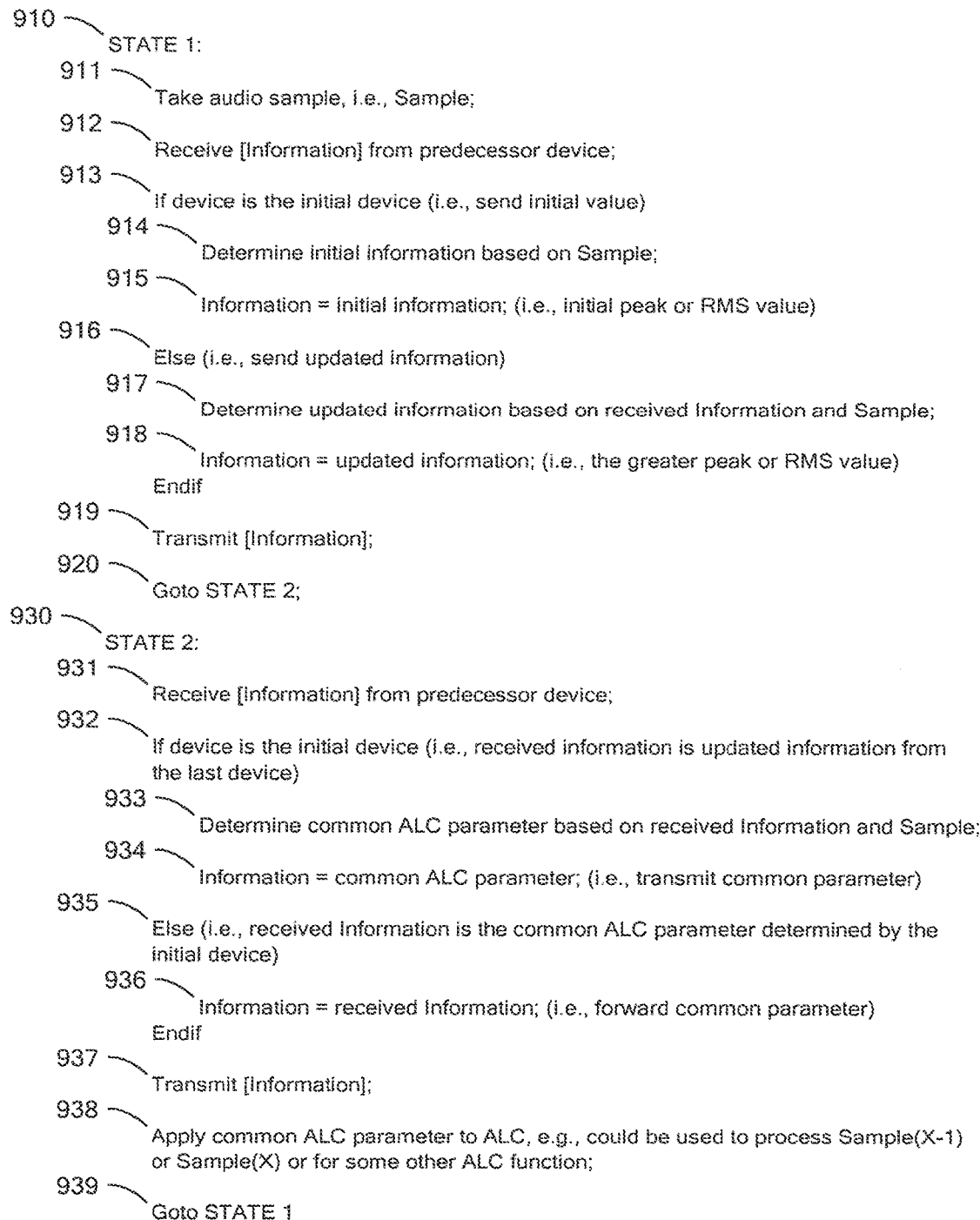
FIG. 9 is a simplified logic flow diagram for a two-stage process for determining and distributing a common automatic level control parameter based on exchange of peak or RMS values, in accordance with one exemplary embodiment.

FIG. 9 is a simplified logic flow diagram for a two-stage process for determining and distributing a common automatic level control parameter based on exchange of peak or RMS values, in accordance with one exemplary embodiment.

During the first stage (i.e., State 1—910), each microphone device takes an audio sample (911), typically synchronized to a common reference clock. Each microphone device also receives Information (912) from its predecessor device in the normal course. If the device is the initial device (913), then the device determines initial information based on the Sample (914), e.g., a peak or RMS value for the Sample, and the information to be transmitted by the device is the that initial information (915). Otherwise (916), the microphone device determines updated information based on the received Information and the Sample (917), e.g., the higher peak or RMS value, and the information to be transmitted by the device is the updated information (918). The microphone device transmits its information to the next successive device (919) and transitions to State 2 (920).

During the second stage (i.e., State 2—930), each device receives Information from its predecessor device (931). If the device is the initial device (932), then the received Information is updated information from the last microphone device, in which case the device determines the common automatic level control parameter based on the received Information and the device's audio sample data (933), e.g., the maximum peak or RMS value across the devices, and the information to be transmitted by the device is the common automatic level control parameter (934). Otherwise (935), the received information is the common automatic level control parameter passed from its predecessor device, in which case the information to be transmitted by the device is the received Information (936), i.e., the device simply passes along the value it received. The device transmits the common automatic level control parameter to the next successive device (937), optionally may apply the common automatic level control parameter to the automatic level controller (938), and transitions to State 1 (939).

While the examples described with reference to FIGS. 8 and 9 relate to a maximum peak or RMS value, it should be noted that alternative embodiments similarly may determine and distribute other values, such as a minimum peak or RMS value, an average value across the microphone devices, a gain value to be used by all microphone devices, or other value.

Exemplary Communication Systems

It should be noted that information related to a common automatic level control parameter may be distributed to the various microphone devices using any of a variety of communication systems that allow data to be provided to, or exchanged among, the microphone devices.

Figure 11:
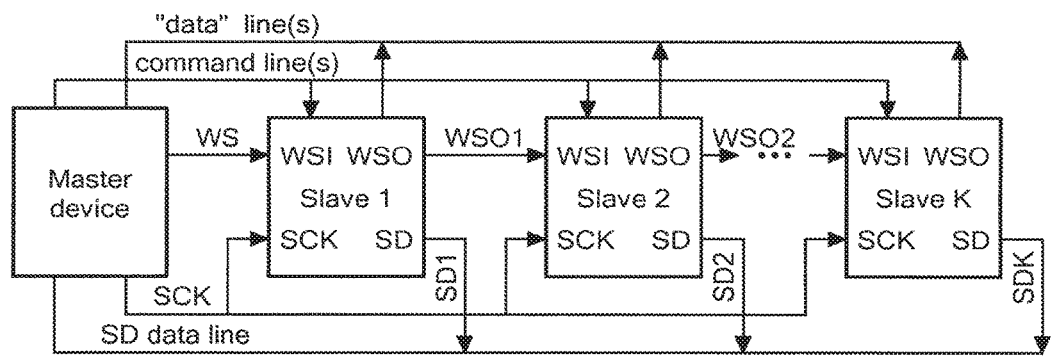
FIGS. 11-13 are schematic block diagrams showing various time-division multiplex (TDM) daisy-chain configurations in which distributed automatic level control may be used.
Figure 12:
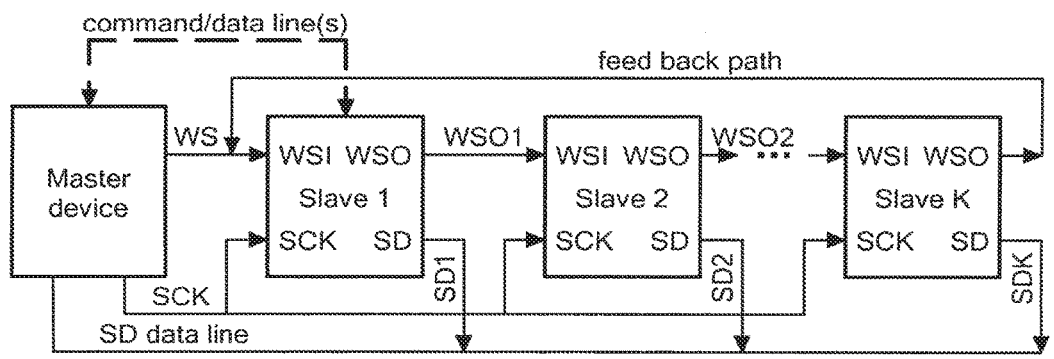
Figure 13:
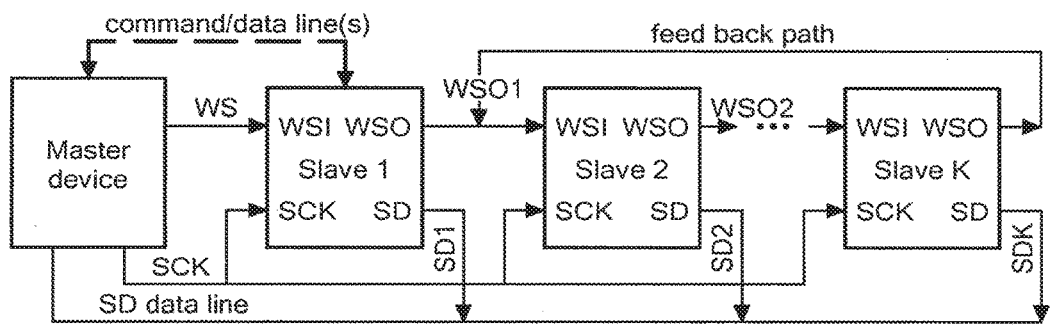

FIGS. 11-13 are schematic block diagrams showing some of various time-division multiplex (TDM) daisy-chain configurations in which distributed automatic level control may be used. These daisy-chain configurations are described in the United States Patent Application entitled ADVANCED TDM DAISY-CHAIN COMMUNICATION SYSTEMS AND DEVICES filed on even date herewith, which also described various alternative TDM daisy-chain configurations in which distributed automatic level control may be used.

In the TDM daisy-chain configuration shown in FIG. 11, raw audio sample data may be transmitted by the slave (microphone) devices to the master device (e.g., over the data/command lines), which may compute a common automatic level control parameter and distribute the common automatic level control parameter to the microphone devices for use by the automatic level controller in each microphone device to generate processed TDM data that may be transmitted to the master device via the SD data line.

In the TDM daisy-chain configuration shown in FIG. 12, the slave (microphone) devices may send information to one another via the WS path (e.g., Slave 1 may transmit information to Slave 2 over the WSO1 line, Slave 2 may transmit information to Slave 2 over the WSO2 line, etc., and Slave K may transmit information back to Slave 1 via the feedback path.

In the TDM daisy-chain configuration shown in FIG. 13, the slave (microphone) devices may send information to one another via the WS path (e.g., Slave 1 may transmit information to Slave 2 over the WSO1 line, Slave 2 may transmit information to Slave 2 over the WSO2 line, etc., and the last microphone device (Slave K) may transmit information back to Slave 1 and/or Slave 2 via the feedback path.

Figure 10:
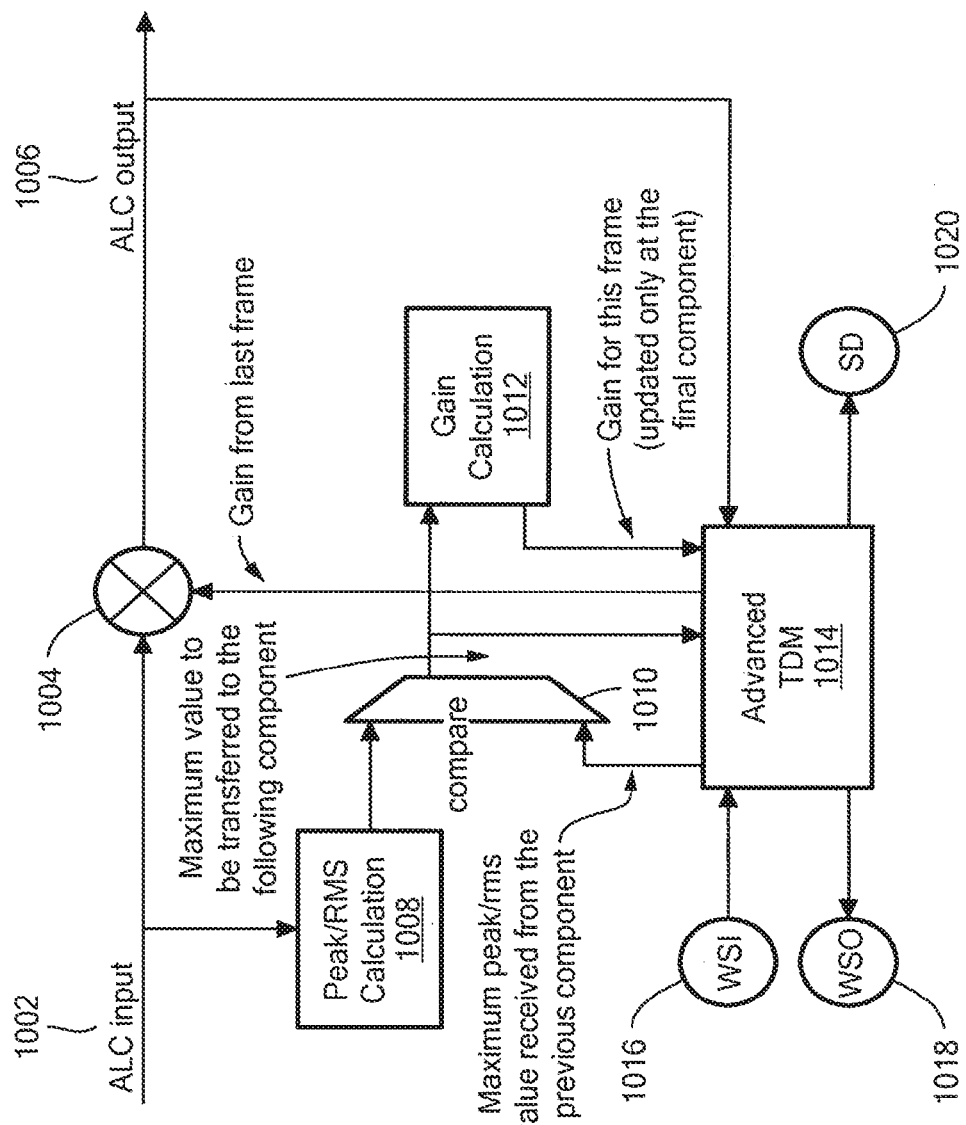
FIG. 10 is a schematic block diagram showing an automatic level controller circuit that may be used in each microphone device in certain exemplary embodiments.

FIG. 10 is a schematic block diagram showing an automatic level controller circuit that may be used in each microphone device in certain exemplary embodiments. Here, a peak or RMS calculation 1008 is made for an ALC input 1002 (e.g., audio sample data). This peak or RMS calculation 1008 may be compared to a maximum peak or RMS value received from the previous device (e.g., via WSI 1016 and the advanced TDM interface 1014) by comparator 1010, with the larger value used for a gain calculation in block 1012 and/or transmitted to the next successive device via the advanced TDM interface 1014 (e.g., via WSO 1018). The gain calculations from block 1012 can be combined with the ALC input 1002 to produce an ALC output 1006 and/or may be used to generate data to be transmitted by the advanced TDM interface 1014, e.g., via the SD line 1020.

Figure 14:
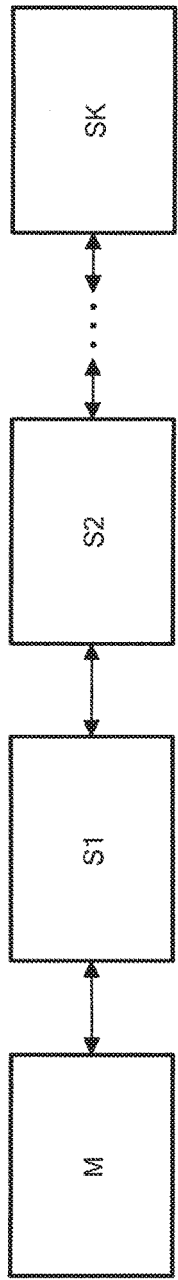
FIG. 14 is a schematic diagram of a two-wire bi-directional point-to-point bus configuration.

FIG. 14 is a schematic diagram of a two-wire bi-directional point-to-point bus configuration as described in U.S. patent application Ser. No. 13/646,397. An exemplary bi-directional point-to-point bus embodiment is now described. Here, each pair of adjacent devices (e.g., the master M and the first slave S1, the first slave S1 and the second slave S2, etc.) is connected by a two-wire bus segment, e.g., unshielded twisted pair (UTP) wiring with appropriate connectors. Communications between adjacent devices over the corresponding two-wire bus segment is essentially half-duplex, e.g., the first slave device does not transmit while the master device is transmitting to it, and vice versa. In order to allow for communications between the master and any given slave, and between slave devices on a peer-to-peer basis, intermediate slave devices essentially relay information. Communications over the various bus segments are essentially independent of one another, and each slave device can selectively pass along the information it receives (e.g., similar to a repeater), remove information before passing along information (e.g., strip information intended for the particular slave device), and/or add information (e.g., insert data into a time slot designated for the particular slave device). In this way, information related to a common automatic level control parameter can be transmitted from device-to-device for a distributed ALC function. For example, raw audio sample data may be transmitted by the slave devices to the master device, which may determine the common automatic level control parameter and distributed the common automatic level control parameter to the slave devices for use by the automatic level controller in each slave device to generate processed TDM data that may be transmitted to the master device. Alternatively, one of the slave devices (e.g., the last slave device) may receive raw audio sample data or other information from the upstream devices, determine the common automatic level control parameter, and transmit the common automatic level control parameter to the other slave devices for use by the automatic level controller in each microphone device to generate processed TDM data that may be transmitted to the master device.

Of course, information related to a common automatic level control parameter may be distributed to the various microphone devices using other types of communication systems. As but one further example, in a communication system in which the devices share a common bi-directional bus or otherwise can receive data from all other devices (either serially or in parallel), each may receive raw data sample data from all of the other devices and may determine therefrom the common automatic level control parameter, such as, for example, the maximum peak or RMS value or average for all of the audio samples.

Exemplary Frame-Based Processing

In certain exemplary embodiments, a common automatic level control parameter such as a maximum or minimum peak or RMS value, an average value, a gain value, or other value is produced for each audio sampling frame based on audio samples from the microphone devices in that frame or in a prior frame, and each microphone device applies the common automatic level control parameter to its automatic level controller. Thus, for example, in each frame, the microphone devices may exchange information for the common automatic level control parameter for the current frame and also exchange the common automatic level control parameter for the previous frame.

Figure 15:
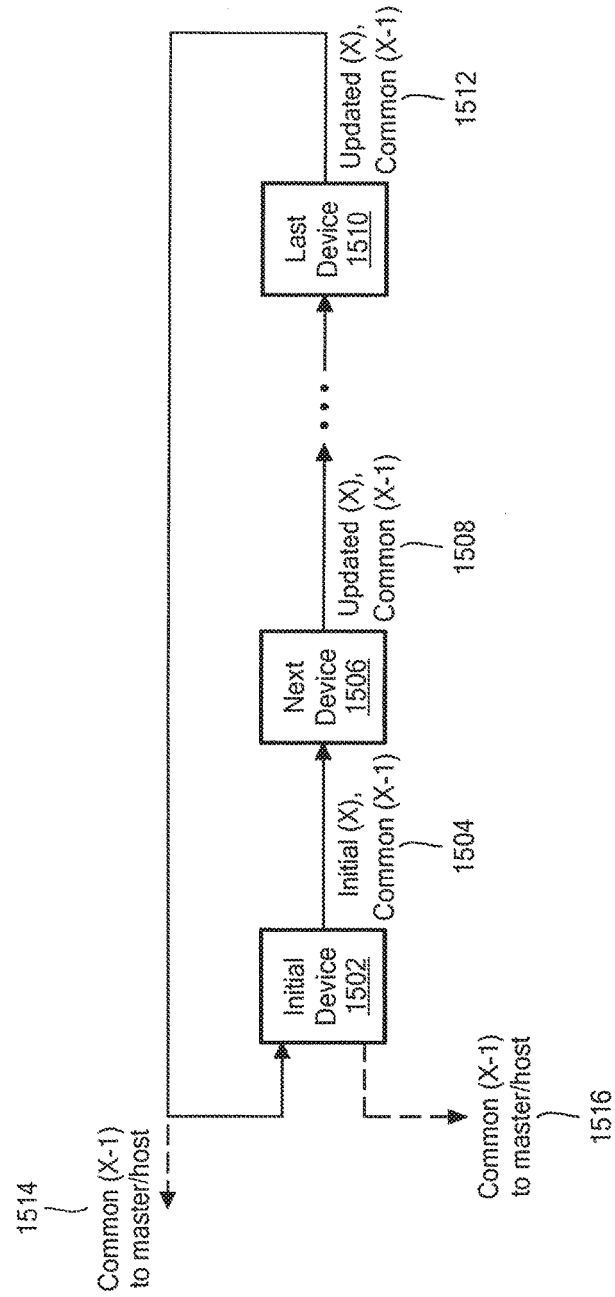
FIG. 15 is a schematic diagram depicting a frame-based sequence for exchanging information allowing the microphone devices to produce the common automatic level control parameter, in accordance with one exemplary embodiment.

In one exemplary embodiment depicted schematically in FIG. 15, in order for each microphone device to produce the common automatic level control parameter, an initial microphone device 1502 transmits a data packet 1504 including initial information for the current frame X based on its own audio sample data (i.e., "Information(X)") along with the common automatic level control parameter for the prior frame (X−1) (i.e., "Common(X−1)") to a next successive microphone device 1506. Each successive microphone device receives information from the predecessor microphone device, determines updated information based on the received information and its own audio sample data (e.g., raw sample data having the greater peak or RMS value, or the higher peak or RMS value), and transmits the updated information (i.e., "Updated(X)") along with the received common automatic level control parameter (i.e., "Common (X−1)") to the next successive device (where the updated information may be the same as the received information or may be different than the received information depending on any of a variety of factors). When the initial microphone device 1502 receives updated information 1512 from the last microphone device 1510, it then can produce a common automatic level control parameter for frame X and distribute it to the other microphone devices, such as by transmitting it to the next successive microphone device along with initial information for the next frame (i.e., frame (X+1)) such that the common automatic level control parameter for frame X is distributed to all microphone devices. In each frame, each microphone device applies a common automatic level control parameter to the automatic level controller of the microphone device, for example applying the common automatic level control parameter from frame (X−1) to audio sample data from frame (X−1), to audio sample data from frame X, or otherwise. The initial microphone device 1502 (or another microphone device, e.g., the last microphone device 1510) additionally may transmit the common automatic level control parameter to the master/host device, e.g., over the same data path used by the microphone devices to exchange data 1514 or over a separate path 1516 (where the dashed lines for paths 1514 and 1516 indicate that various embodiments may include one, the other, both, or neither path). The master/host device may use the common automatic level control parameter to process data received from the microphone devices.

FIG. 16 is a simplified logic flow diagram for a recursive process for determining and distributing a common automatic level control parameter, in accordance with one exemplary embodiment. For a frame X, each microphone device takes an audio sample for frame X (1601), typically synchronized to a common reference clock. Each microphone device also receives Information and a Common value (1602) from its predecessor device in the normal course. If the device is the initial device (1603), then received Information is the updated information from the last device relating to frame (X−1), in which case the device determines the common automatic level control parameter for frame (X−1) based on the received Information and the device's audio sample data from frame (X−1) (1604) and therefore determines the common value to transmit (1605), e.g., the maximum peak or RMS value across the devices, and determines initial information for frame X based on the device's audio sample data for frame X (1606) and therefore determines information to transmit (1607). Otherwise (1608), the device determines updated information for frame X based on the received Information and the device's audio sample data for frame X (1609), e.g., the raw sample data having the higher peak or RMS value, or the higher peak or RMS value itself, and therefore determines the information to be transmitted (1610); in this case, the common value to be transmitted is the received Common value (1611). The device transmits the Information and Common values to the next successive device (1612) and optionally may apply the common automatic level control parameter for frame (X−1) to the automatic level controller (1613).

Figure 17:
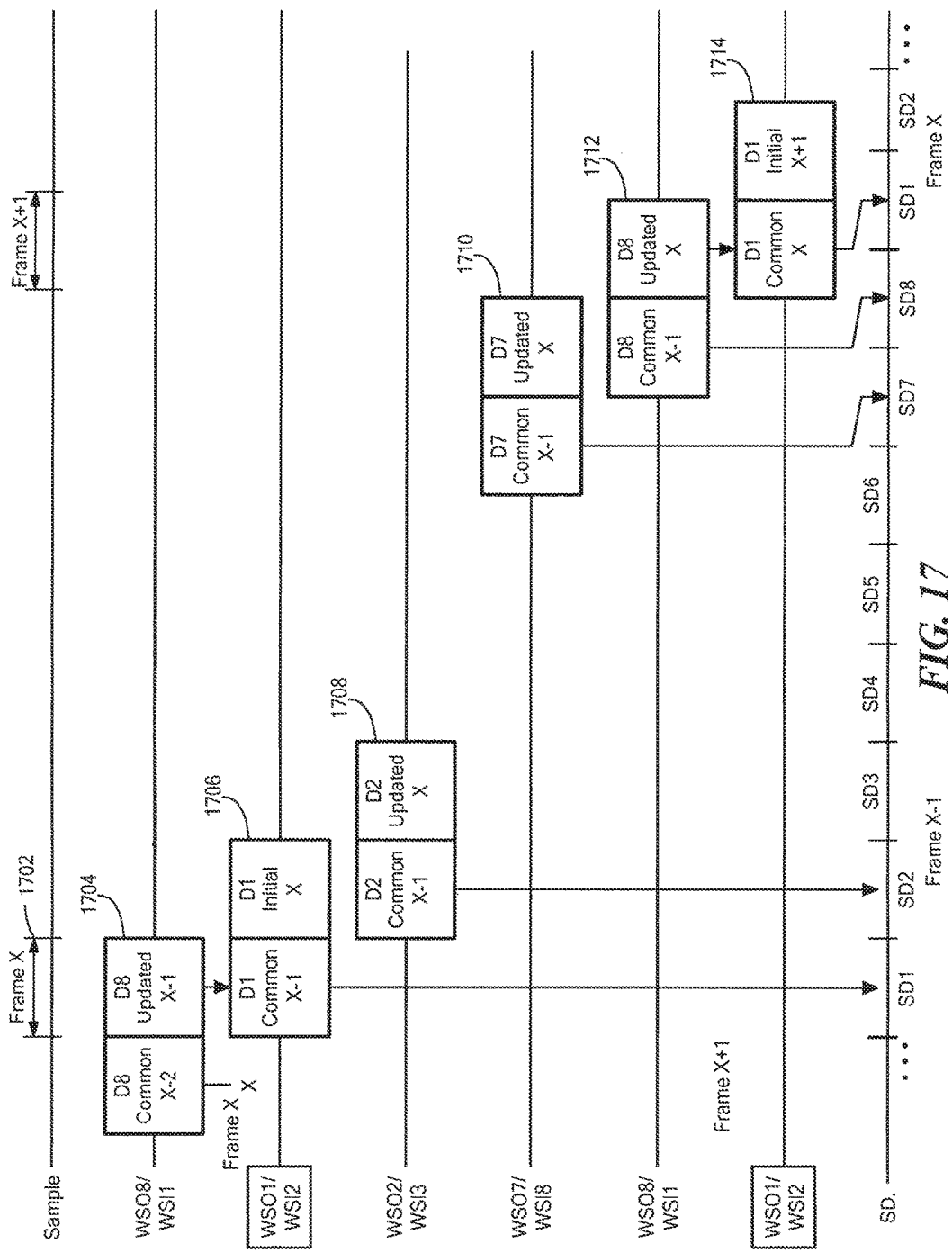
FIG. 17 is a schematic timing diagram for determining and distributing common automatic level control parameters for frames that may be used for microphone devices in a daisy-chain configuration of the type shown in FIG. 12, in accordance with but one exemplary embodiment.

FIG. 17 is a schematic timing diagram for determining and distributing common automatic level control parameters for frames that may be used for microphone devices in a daisy-chain configuration of the type shown in FIG. 12, in accordance with but one exemplary embodiment. This example is based on eight microphone devices, where device 1 effectively is the initial device, as indicated by the boxes drawn around "WSO1/WSI2," which is the WS output of device 1 and the consequently the WS input of device 2. For each frame, all of the microphone devices are caused to take an audio sample, as indicated in the top line marked "sample." In certain exemplary embodiments, the audio sampling may be synchronized. Thus, for example, all of the microphones may take an audio sample for frame X at time slot 1702. For frame X, device 1 determines the common automatic level control parameter for frame (X−1) based on the updated information it receives from device 8 (i.e., D8) for frame (X−1) in data packet 1704 and transmits a data packet 1706 including the common automatic level control parameter for frame (X−1) as well as initial information for frame X via its WSO1 pin. Device 1 can use the common automatic level control parameter for frame (X−1) in its automatic level controller to generate TDM data (i.e., SD1). Different implementations may apply the common automatic level control parameter differently (in this example, the parameter is used to generate TDM data for frame (X−1), although other implementations may use the parameter to generate TDM data for frame X or for some other frame), and different implementations may have different timing relationships between the taking of audio samples, the transmission of information via the WS lines, the transmission of TDM data, and other operations. Each successive device from device 2 through device 8 receives data from its predecessor device via its WSI pin, generates updated data for frame X, and transmits the common value for frame (X−1) that it received via its WSI pin followed by updated data for frame X. Thus, for example, device 2 receives the data packet 1706 from device 1 via its WSI pin, generates updated data for frame X, and transmits data packet 1708 including the common value for frame (X−1) that it received via its WSI pin followed by updated data for frame X (i.e., "D2 Updated X"). Similarly, device 8 receives the data packet 1710 from device 7 via its WSI pin, generates updated data for frame X, and transmits data packet 1712 including the common value for frame (X−1) that it received via its WSI pin followed by updated data for frame X (i.e., "D8 Updated X"). When device 1 receives the data packet 1712 from device 8, it generates the common automatic level control parameter for frame X and transmits data frame 1714 on its WSO pin including the common automatic level control parameter for frame X (i.e., "D1 Common X") along with initial data for frame (X+1) derived from a new data sample taken for frame (X+1) to start a new cycle for the next frame.

It should be noted that the common automatic level control parameter may be transmitted to the master/host device, as discussed above. In the example described with reference to FIG. 17 (which is based on a daisy-chain configuration of the type shown in FIG. 12), when device 1 determines the common automatic level control parameter for a frame (e.g., "Common (X−1)" that is transmitted in data packet 1706), device 1 may transmit the common automatic level control parameter to the master/host device, e.g., over the separate command/data lines shown in FIG. 12. Alternatively, in certain embodiments, when device 8 transmits a data packet on its WSO pin (e.g., data packet 1712 containing "Common (X−1)"), the data packet may be received by the master/host via its WS pin, e.g., by switching the WS pin to an input.

Figure 18:
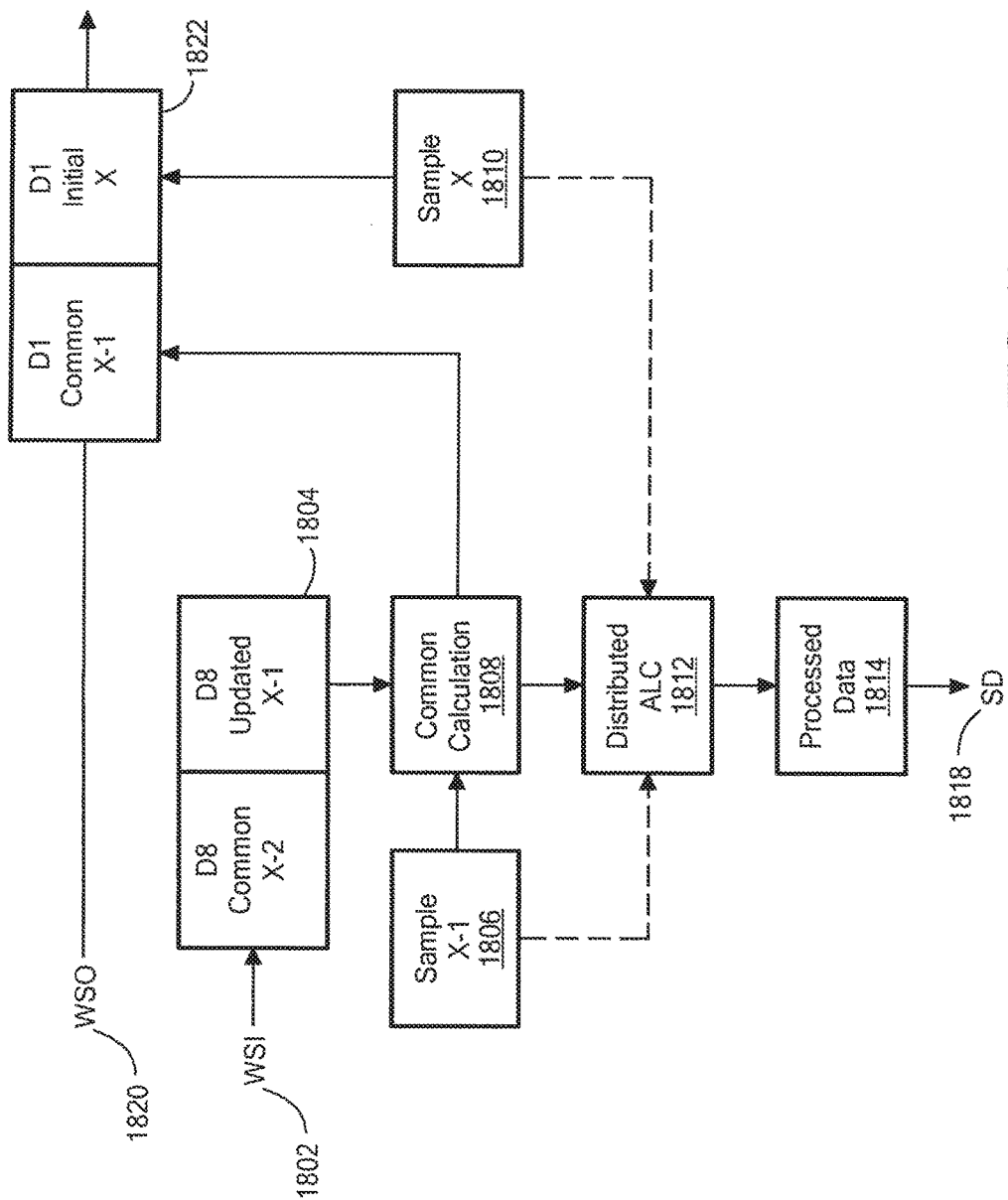
FIGS. 18 and 19 are schematic block diagrams showing relevant logic blocks of microphone devices providing one possible implementation for the timing diagram of FIG. 17.
Figure 19:
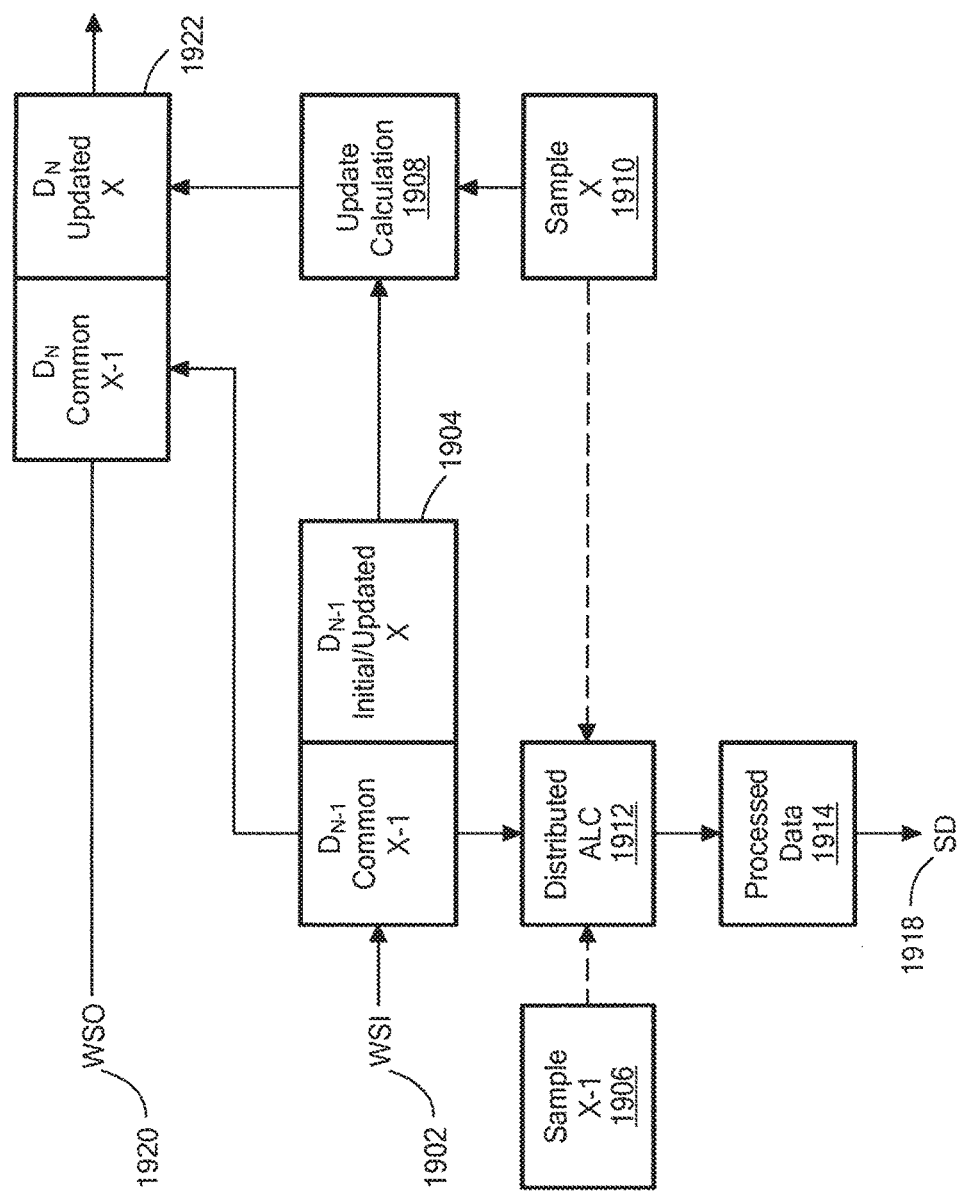

FIGS. 18 and 19 are schematic block diagrams showing relevant logic blocks of microphone devices providing one possible implementation for the timing diagram of FIG. 17. Specifically, FIG. 18 is a schematic block diagram for the initial device in the daisy-chain configuration, and FIG. 19 is a schematic block diagram for each of the remaining devices in the daisy-chain configuration. In this example, the devices transmit raw audio sample data. The block diagrams represent operation for a particular frame X.

With reference to FIG. 18, the initial device receives from the last device (device 8 in this example) via its WSI pin 1802 a data packet 1804 including the common value from frame (X−2) and an updated value for frame (X−1). The device uses the received updated value for frame (X−1) and optionally a sample from frame (X−1) 1806 to determine the common automatic level control parameter 1808 for frame (X−1), which then may be applied by distributed automatic level controller 1812 to perform the distributed ALC function. The distributed automatic level controller 1812 may apply the common ALC parameter to the sample from frame (X−1) 1806, the sample from frame X 1810, or other data to produce processed data 1814, which then may be transmitted over a communication system 1818. The device transmits on its WSO line 1820 a packet 1822 including the common ALC value from block 1808 and the raw audio sample data from block 1810.

With reference to FIG. 19, the device receives from the predecessor device via its WSI pin 1902 a data packet 1904 including the common value for frame (X−1) and the initial or updated value for frame X. The received common value for frame (X−1) may be applied by distributed automatic level controller 1912 to perform the distributed ALC function. The distributed automatic level controller 1912 may apply the common ALC parameter to a sample from frame (X−1) 1906, the sample from frame X 1910, or other data to produce processed data 1914, which then may be transmitted over a communication system 1918. The initial/updated value for frame X received in data packet 1904 and the sample for frame X 1910 are used to determine an updated value 1908. The device transmits on its WSO line 1920 a data packet 1922 including the common ALC parameter for frame (X−1) received in packet 1904 and the updated value from block 1908.

It should be noted that frame-based processing may be implemented differently in different systems, for example, based on the way in which the devices are interconnected, the protocols used for exchanging information to or between devices, etc.

Also, any of a variety of timing relationships may be used in various alternative embodiments. For example, a common automatic level control parameter computed for a frame X may be used to for distributed automatic level control for data samples taken in frame X, in an earlier frame, or in a later frame.

As but one further example, with reference again to FIG. 17, when the initial device receives the common value for frame (X−2) from device 8, the common (X−2) value may be used by all of the devices to produce the common automatic level control parameter (since, at that time, all devices will have received the value for frame (X−2)), while the common value for frame (X−1) is distributed to the other devices.

Figure 20:
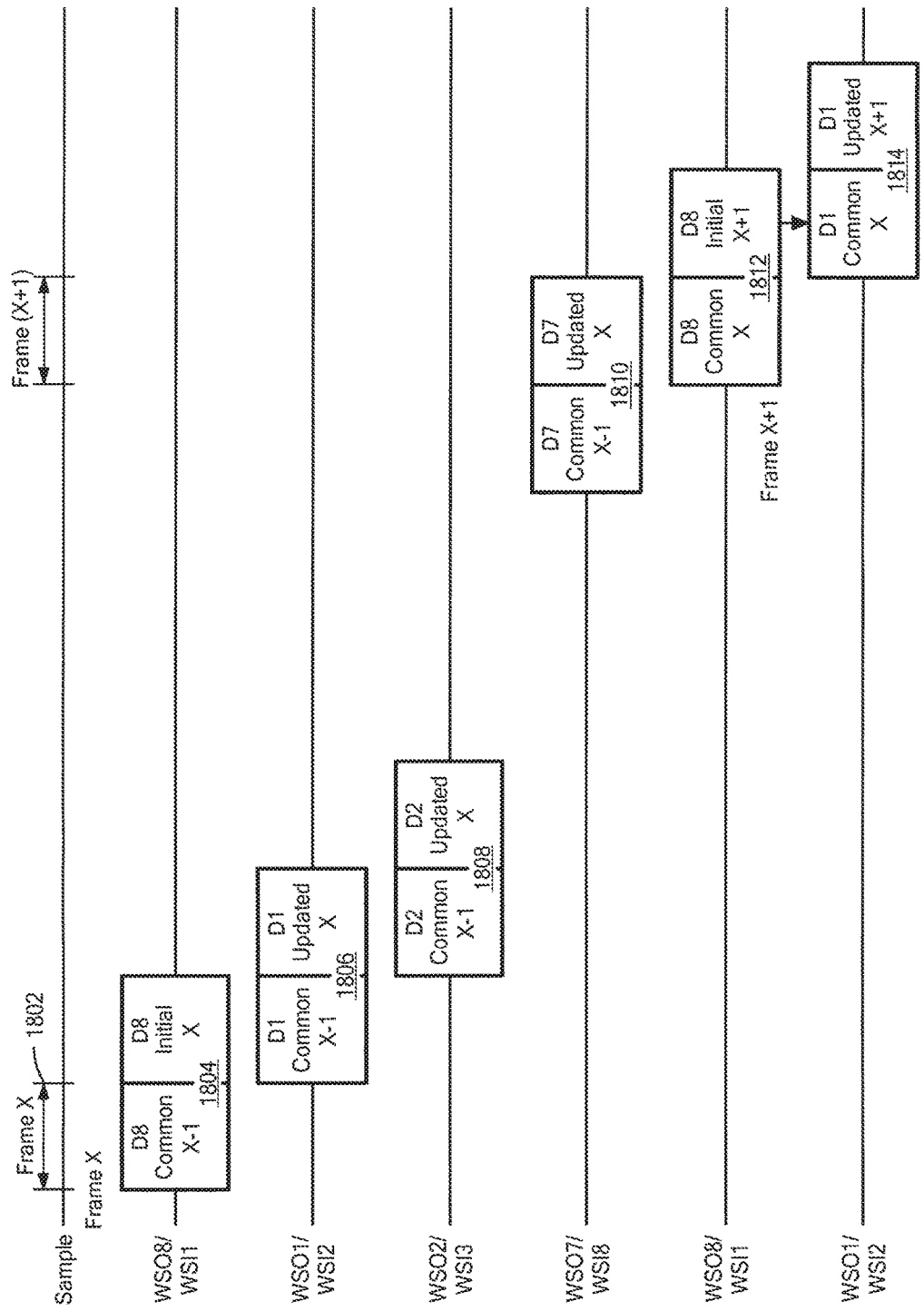
FIG. 20 is a schematic timing diagram for determining and distributing common automatic level control parameters for frames that may be used for microphone devices in a daisy-chain configuration of the type shown in FIG. 12, in accordance with another exemplary embodiment.

FIG. 20 is a schematic timing diagram for determining and distributing common automatic level control parameters for frames that may be used for microphone devices in a daisy-chain configuration of the type shown in FIG. 12, in accordance with another exemplary embodiment. This exemplary embodiment is similar to the one described above with reference to FIG. 17, but in this example, the last device (i.e., device 8) is the initial device. Thus, for frame X, device 8 transmits a data packet 1804 including the common automatic level control parameter for frame (X−1) as well as the initial value for frame X derived from a sample taken for frame X in time slot 1802. Both the master/host device and device 1 receive the data packet 1804 via the WSO8 feedback path and thus both the master/host and device 1 receive the common automatic level control parameter for frame (X−1). Upon receiving the data packet 1804 from device 8 via its WSI pin, device 1 generates updated data for frame X, and transmits data packet 1806 including the common value for frame (X−1) that it received via its WSI pin followed by updated data for frame X (i.e., "D1 Updated X"). Similarly, device 2 receives the data packet 1806 from device 1 via its WSI pin, generates updated data for frame X, and transmits data packet 1808 including the common value for frame (X−1) that it received via its WSI pin followed by updated data for frame X (i.e., "D2 Updated X"). When device 8 receives the data packet 1810 from device 7, device 8 computes the common automatic level parameter for frame X and transmits a data packet 1812 via the WSO8 pin including the common automatic level parameter for frame X and the initial value for frame (X+1) to start a new cycle for the next frame. Unlike the embodiment described with reference to FIG. 17, this embodiment described with reference to FIG. 20 allows the master/host device to receive the common automatic level control parameter for a given frame prior to its distribution and use by the microphone devices, without requiring device 1 to forward the value to the master/host device over separate command/data lines or otherwise.

MISCELLANEOUS

It should be noted that the term "data packet" is used above to reference certain units of data transmitted between devices. The use of this term is for convenience and does not limit embodiments of the present invention to any particular data format or communication protocol.

It will be understood by any person of ordinary skill in the art that it would be virtually impossible to describe herein every possible manner of implementing a distributed automatic level control function, and, in particular, every possible type of device that can support a distributed ALC function, every type of distributed ALC circuit, every type of communication system that can support a distributed ALC function, every possible way of exchanging information with and between devices, every possible type of information that can be exchanged with or between devices, etc. Various exemplary embodiments are described above, and from these exemplary embodiment, various alternatives will be understood.

It should be noted that headings are used above for convenience and are not to be construed as limiting the present invention in any way.

Various aspects of the present invention may be embodied in many different forms, including, but in no way limited to, computer program logic for use with a processor (e.g., a microprocessor, microcontroller, digital signal processor, or general purpose computer), programmable logic for use with a programmable logic device (e.g., a Field Programmable Gate Array (FPGA) or other PLD), discrete components, integrated circuitry (e.g., an Application Specific Integrated Circuit (ASIC)), or any other means including any combination thereof. Computer program logic implementing some or all of the described functionality is typically implemented as a set of computer program instructions that is converted into a computer executable form, stored as such in a computer readable medium, and executed by a microprocessor under the control of an operating system. Hardware-based logic implementing some or all of the described functionality may be implemented using one or more appropriately configured FPGAs.

Computer program logic implementing all or part of the functionality previously described herein may be embodied in various forms, including, but in no way limited to, a source code form, a computer executable form, and various intermediate forms (e.g., forms generated by an assembler, compiler, linker, or locator). Source code may include a series of computer program instructions implemented in any of various programming languages (e.g., an object code, an assembly language, or a high-level language such as Fortran, C, C++, JAVA, or HTML) for use with various operating systems or operating environments. The source code may define and use various data structures and communication messages. The source code may be in a computer executable form (e.g., via an interpreter), or the source code may be converted (e.g., via a translator, assembler, or compiler) into a computer executable form.

The computer program may be fixed in any form (e.g., source code form, computer executable form, or an intermediate form) either permanently or transitorily in a tangible storage medium, such as a semiconductor memory device (e.g., a RAM, ROM, PROM, EEPROM, or Flash-Programmable RAM), a magnetic memory device (e.g., a diskette or fixed disk), an optical memory device (e.g., a CD-ROM), a PC card (e.g., PCMCIA card), or other memory device. The computer program may be fixed in any form in a signal that is transmittable to a computer using any of various communication technologies, including, but in no way limited to, analog technologies, digital technologies, optical technologies, wireless technologies (e.g., Bluetooth), networking technologies, and internetworking technologies. The computer program may be distributed in any form as a removable storage medium with accompanying printed or electronic documentation (e.g., shrink wrapped software), preloaded with a computer system (e.g., on system ROM or fixed disk), or distributed from a server or electronic bulletin board over the communication system (e.g., the Internet or World Wide Web).

Hardware logic (including programmable logic for use with a programmable logic device) implementing all or part of the functionality previously described herein may be designed using traditional manual methods, or may be designed, captured, simulated, or documented electronically using various tools, such as Computer Aided Design (CAD), a hardware description language (e.g., VHDL or AHDL), or a PLD programming language (e.g., PALASM, ABEL, or CUPL).

Programmable logic may be fixed either permanently or transitorily in a tangible storage medium, such as a semiconductor memory device (e.g., a RAM, ROM, PROM, EEPROM, or Flash-Programmable RAM), a magnetic memory device (e.g., a diskette or fixed disk), an optical memory device (e.g., a CD-ROM), or other memory device. The programmable logic may be fixed in a signal that is transmittable to a computer using any of various communication technologies, including, but in no way limited to, analog technologies, digital technologies, optical technologies, wireless technologies (e.g., Bluetooth), networking technologies, and internetworking technologies. The programmable logic may be distributed as a removable storage medium with accompanying printed or electronic documentation (e.g., shrink wrapped software), preloaded with a computer system (e.g., on system ROM or fixed disk), or distributed from a server or electronic bulletin board over the communication system (e.g., the Internet or World Wide Web). Of course, some embodiments of the invention may be implemented as a combination of both software (e.g., a computer program product) and hardware. Still other embodiments of the invention are implemented as entirely hardware, or entirely software.

The present invention may be embodied in other specific forms without departing from the true scope of the invention. Any references to the "invention" are intended to refer to exemplary embodiments of the invention and should not be construed to refer to all embodiments of the invention unless the context otherwise requires. The described embodiments are to be considered in all respects only as illustrative and not restrictive.

What is claimed is:

1. A communication system comprising:
a plurality of microphone devices including an initial microphone device and a plurality of microphone devices, each of the plurality of microphone devices including an automatic level controller to generate processed time division multiplexing (TDM) data, the plurality of microphone devices including a first microphone device and a last microphone device, the plurality of microphone devices arranged in a TDM daisy-chain configuration, each of the plurality of microphone devices including a distributed automatic level controller,
wherein, except the initial microphone device, each of the plurality of microphone devices is responsive to a word input signal and a serial input clock and configured to generate a word output signal, the word input signal of each of the plurality of microphone devices being representative of information relating to a common automatic level control parameter, the automatic level control parameter being indicative of characteristics of the plurality of microphone devices, the word output signal of each of the plurality of microphone devices being coupled to a data line and, except the last microphone device, to the word input signal of a next successive microphone device of the plurality of microphone devices, the data line being further coupled to the initial microphone device,
further wherein the word output signal of the initial microphone device is an initial information based on an audio sample of at least one different microphone device of the plurality of microphone devices,
wherein each of the plurality of microphone devices is configured to apply the common automatic level control parameter to the distributed automatic level controller of the respective microphone device to update the word output signal of the respective microphone device.

2. The communication system of claim 1, wherein the initial microphone device is a master microphone device.

3. The communication system of claim 1, wherein the word output signal of each of the plurality of microphone devices includes raw data or processed data.

4. The communication system of claim 1, wherein the word output signal of each of the plurality of microphone devices includes raw audio sample data, a peak or root-mean square (RMS) value computed from an audio sample, a gain value, a maximum signal level for a particular audio sampling frame, a minimum signal level for a particular audio sampling frame, or other information related to the common automatic level control parameter.

5. The communication system of claim 1, wherein the common automatic level control parameter is a maximum peak or RMS value.

6. The communication system of claim 1, wherein the initial microphone device is responsive to raw audio sample data from the last microphone device and it is configured to compare the received raw audio sample data with the audio sample to determine the maximum peak or RMS value across the plurality of microphone devices.

7. The communication system of claim 1, wherein the initial microphone device is configured to determine the maximum peak or a RMS value across the plurality of microphone devices.

8. The communication system of claim 1, wherein the common automatic level control parameter is derived from audio samples associated with one of the common frame or a frame earlier than the common frame.

* * * * *